Figure 1:
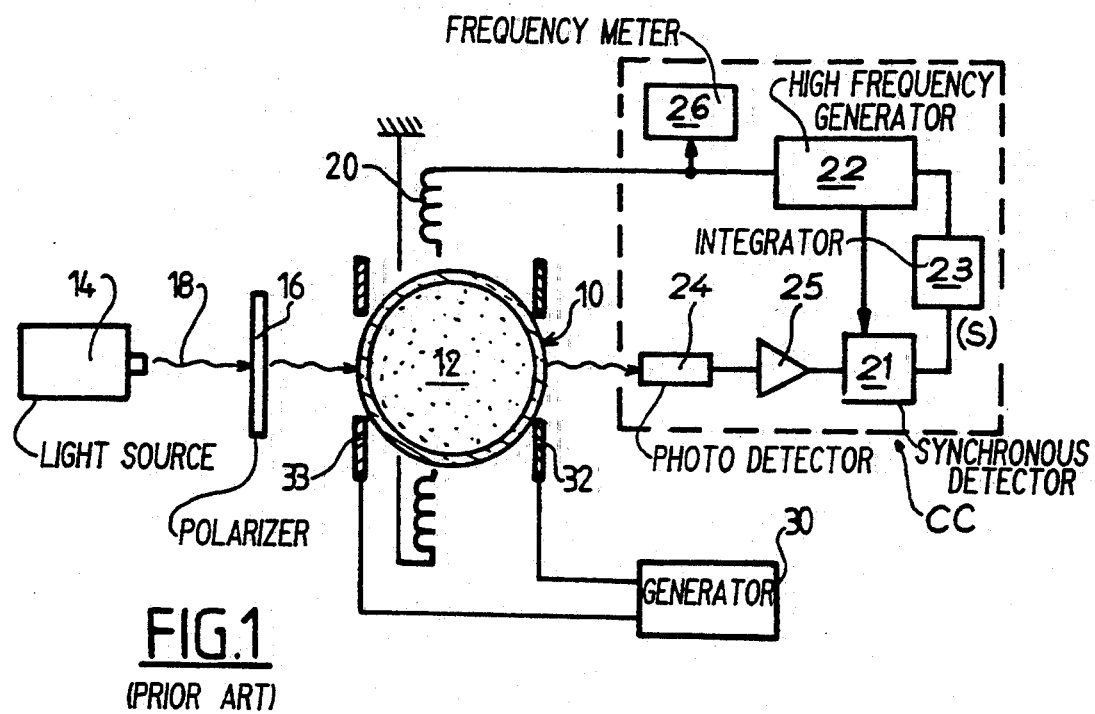

United States Patent
Chaillout et al.

[11] Patent Number: 5,272,436
[45] Date of Patent: Dec. 21, 1993

[54] OPTICAL PUMPING, RESONANCE MAGNETOMETER USING A LIGHT BEAM WITH CONTROLLED POLARIZATION

[75] Inventors: Jean-Jacques Chaillout, St Etienne de Crossey; Nelly Kernevez, Grenoble; Jean-Michel Leger, Meylan, all of France

[73] Assignee: Commissariat a l'Energie Atomique, Paris, France

[21] Appl. No.: 714,704

[22] Filed: Jun. 13, 1991

[30] Foreign Application Priority Data

Jun. 14, 1990 [FR] France .................. 90 07411

[51] Int. Cl.$^5$ .............................................. G01V 3/00
[52] U.S. Cl. ............................ 324/304; 324/301
[58] Field of Search ............ 324/300, 301, 304, 305, 324/307

[56] References Cited

U.S. PATENT DOCUMENTS 3,197,694  7/1965  Cunningham ............... 324/304
4,780,672  10/1988  McGregor ................... 324/304
4,814,707  3/1989  Marton ........................ 324/304

FOREIGN PATENT DOCUMENTS 0246146  11/1987  European Pat. Off.
2624717  12/1977  Fed. Rep. of Germany.
1354208  1/1964  France.

OTHER PUBLICATIONS

"Polarisation des gaz"; vol. 45, No. 12, Dec. 1980; R. Chassagnon et al., (pp. 69–72).

*Primary Examiner*—Louis Arana
*Attorney, Agent, or Firm*—Oblon, Spivak, McClelland, Maier & Neustadt

[57] ABSTRACT

Optical pumping magnetometer with controlled polarization.

This magnetometer comprises a linear polarizer (16), whose orientation is controlled (42,44) in such a way that the detection signal is at a maximum, no matter what the orientation of the field to be measured.

Application to the construction of isotropic magnetometers.

8 Claims, 3 Drawing Sheets

OPTICAL PUMPING, RESONANCE MAGNETOMETER USING A LIGHT BEAM WITH CONTROLLED POLARIZATION

DESCRIPTION

The present invention relates to a magnetometer. It is used in the precise measurement of weak magnetic fields (typically in the range 20 to 70 µT corresponding to the values of the earth's magnetic field).

The magnetometer according to the invention is a resonance magnetometer and a general description thereof appears in the article by F. Hartman entitled "Resonance Magnetometers", published in the journal "IEEE Transactions on Magnetics", vol. MAG-8, No. 1, March 1972, pp. 66–75.

A resonance magnetometer is an apparatus which, immersed in a magnetic field Bo, supplies an electric signal of frequency F, whose value is linked with Bo by the so-called Larmour relation:

$$F = \delta B_o$$

in which δ is the gyromagnetic ratio (of an electron or nucleon as a function of the substance used). For example, for the electron this ratio is 28 Hz/nT.

In this class of equipment, the optical pumping magnetometer has a privileged position. The general construction of a magnetic resonance, optical pumping magnetometer is diagrammatically shown in FIG. 1.

An at least partly transparent cell 10 is filled with a gas 12, which is generally helium (isotope 4) at a pressure of 1 to a few Torr. A light source 14 supplies a light beam 18, whose wavelength is approximately 1.1 µm in the case of helium. This beam is appropriately polarized by a means 16 and then injected into the cell 10.

Moreover, a radio frequency or high frequency discharge (so-called weak or gentle discharge) is produced in the gas by a generator 30 connected to two electrodes 32,33 arranged around the cell 10. This discharge produces atoms in a metastable state ($2^3S_1$ in the case of helium). The incident light beam 18 "pumps" these atoms from the metastable state to bring them into a different excited state ($2^3P$).

In the presence of a magnetic field Bo, the energy levels are subdivided into so-called Zeeman sublevels. A high frequency resonance between such sublevels can be established by a high frequency field (magnetic resonance) or by light modulation (double optical resonance; Cohen, Tannoudji, Ann. Phys. 7, 1962, p. 423). In the case of helium (isotope 4), the resonance is established between two electronic Zeeman sublevels of the metastable state. This resonance is revealed by various known electronic means and whereof a variant is shown in FIG. 1. It is constituted by a winding 20 positioned on either side of the cell 10 (in a so-called Helmholtz arrangement), a high frequency generator 22, a photodetector 24 receiving the light radiation which has traversed the cell, an amplifier 25, a synchronous detection means 21 and an integrator 23. All the means 21 to 26 will be subsequently referred to by the reference CC. The generator 22 supplies the winding 20 with current at frequency F, which creates an oscillating magnetic field, whereof one component maintains the resonance and on returning modulates the light beam which has traversed the cell. This modulation forms the signal. It is revealed by synchronous detection at the output of the photodetector, via the amplifier. The reference is given by the generator. The output of the synchronous detection means corresponding to the component of the signal in phase with the reference serves as a static error signal. This error signal readjusts the frequency F of the synthesizer to the Larmor frequency. For this purpose it is necessary for the synthesizer to be voltage-controllable and it can also be replaced by a voltage-controlled oscillator (V.C.O.).

Thus, an electric resonance signal S is established in said loop at the Larmor frequency. A frequency meter 26 gives its value F. The field to be measured Bo is deduced by the relation $B_o = F/\gamma$.

Helium magnetometers of this type initially used helium lamps. The recently discovered lanthanum-neodymium aluminate (or LNA) crystals have made it possible to obtain lasers tuneable around the wavelength of 1.083 µm precisely corresponding to the optical pumping line of helium. Therefore this type of laser has naturally taken the place of such lamps and has led to a significant performance improvement, so that interest has been reawakened with respect to such equipment. Such a magnetometer equipped with a LNA laser is described in FR-A-2 598 518.

Although satisfactory in certain respects, such magnetometers still suffer from disadvantages. Thus, in principle, they are highly anisotropic, both in amplitude and in frequency. Signal suppressions occur for certain orientations of the magnetic field to be measured. These unfavourable orientations correspond either to certain propagation directions of the light beam (in the case of a circular polarization) or to certain polarization directions (in the case of a linear polarization). Optical pumping then no longer produces the requisite polarization of the Zeeman sublevels of the atoms or the detection of the resonance is ineffective.

Various solutions have been proposed for obviating this disadvantage. The US company Texas Instruments e.g. recommends the use of several cells oriented in such a way that at least one supplies a usable signal. The Canadian company Canadian Aviation Electronics recommends the appropriate orientation of the magnetometer with respect to the field to be measured.

As the suppression zones of the signal are more extensive for a linearly polarized beam than for a circularly polarized beam, preference would be given to working with circular polarization. However, in the case of such a polarization, there is a frequency shift phenomenon as a result of the optical pumping, which leads to measurement errors.

Therefore the magnetometer according to the invention uses linear polarization to obviate this error. However, the disadvantages linked with this polarization remain and the solutions proposed, which amount to multiplying the number of equipments, remain relatively unsatisfactory, i.e. excessive overall dimensions, necessity of balancing the various measuring channels, the control of the orientation of the cells, high power consumption, etc. In addition, any installation must be produced in an amagnetic environment, which causes serious technological problems.

The present invention aims at obviating these disadvantages. To this end it proposes an optical pumping, resonance magnetometer, whose isotropy is excellent, whilst still providing a simple construction and relatively small overall dimensions (it only has a single cell).

This objective is achieved by the invention through the use of means making it possible to rotate the linear polarization direction of the beam injected into the cell, in order to give it the optimum direction corresponding to a maximum amplitude of the resonance signal.

Several means can be used for determining and obtaining this optimum direction. In a first variant, the magnetometer comprises a directional magnetometer (such as e.g. an assembly of three flux gates or a EPR (electronic paramagnetic resonance) magnetometer) giving information on the direction of the ambient field Bo to be measured. A circuit for processing said information calculates the optimum polarization orientation corresponding to said direction of the ambient field and controls the rotation of the polarization as a consequence thereof.

In a second variant, the magnetometer comprises means for the low frequency modulation of the polarization direction and for carrying out a synchronous detection of the resonance signal. The detected signal serves as an error signal for correcting the polarization and for giving it the optimum direction.

In a third variant solely relating to a magnetic resonance magnetometer, use is made of a system consisting of arranging several exciting windings with different axes around the cell, which makes it possible to obtain several detection signals and consequently to collect information concerning the orientation of the ambient field with respect to the axes of the windings. It is then still possible to orient the polarization in order to give it the optimum direction.

All these arrangements are applicable to optical pumping, resonance magnetometers, no matter what the medium which is pumped. Naturally, in the present state of the art, helium has a privileged position. However, other known fluids or gases are not excluded with respect to the invention, such as alkali metal vapours (cesium, rubidium, etc.). The resonance can be magnetic (excitation by a high frequency field) or optical (light modulation, optical multiresonance).

In the same way, although preference is attached to the LNA laser in the pumping of helium cells, the invention is not limited to this source and any magnetometer using a random light source forms part of the invention when it works with a controlled polarization beam.

The invention is described in greater detail hereinafter relative to non-limitative embodiments and with reference to the attached drawings, wherein show:

FIG. 1 already described, a prior art magnetometer.

Figure 2:
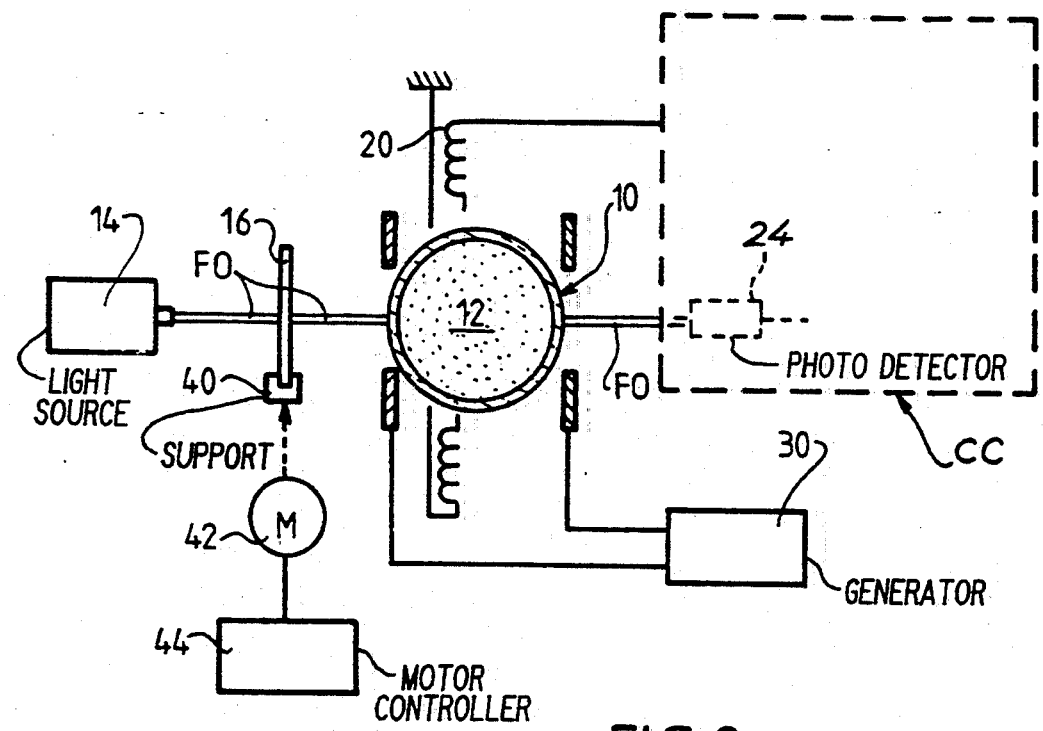

FIG. 2 a general diagram of a magnetometer according to the invention.

Figure 3:
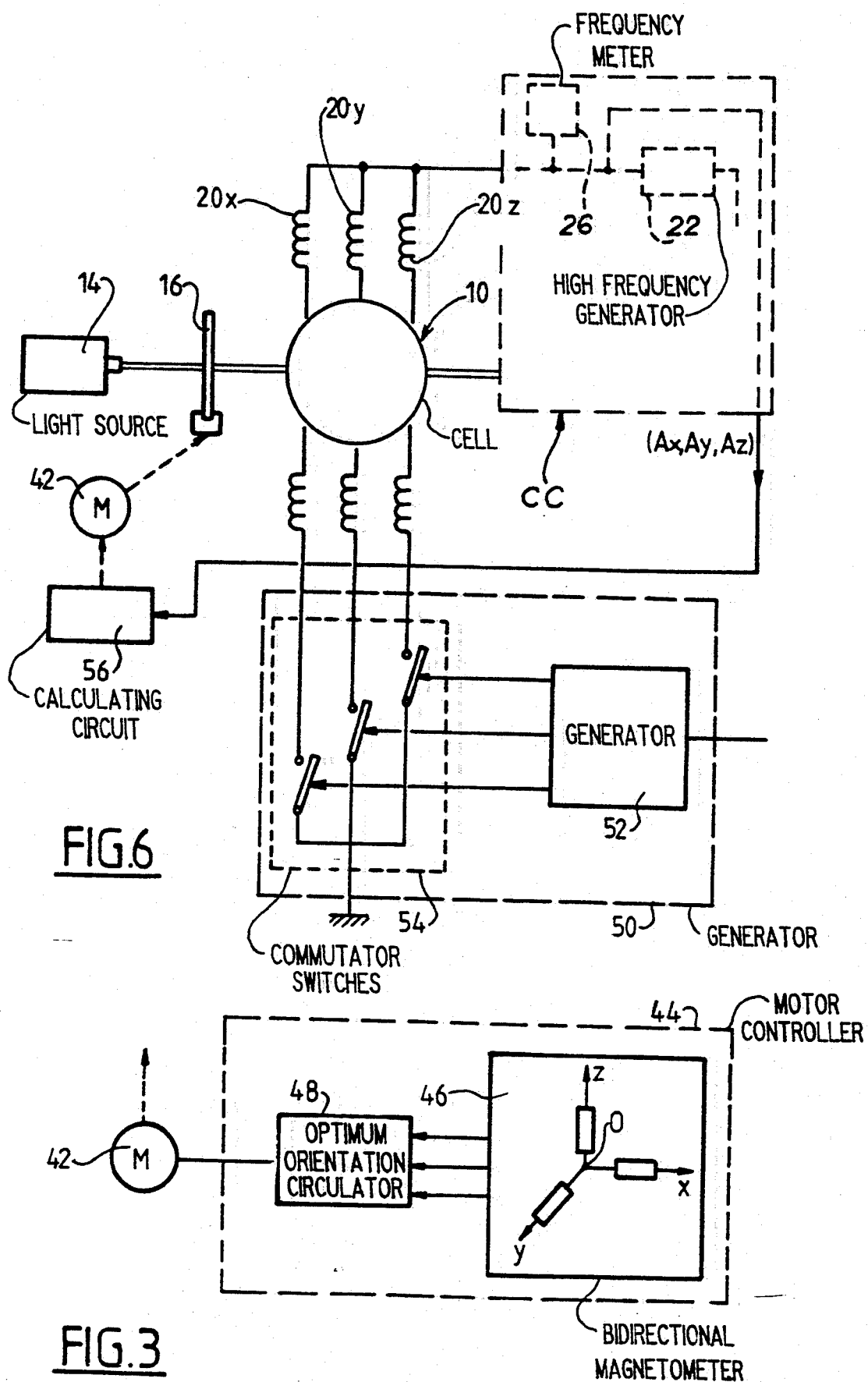

FIG. 3 an embodiment using a directional magnetometer.

Figure 4:
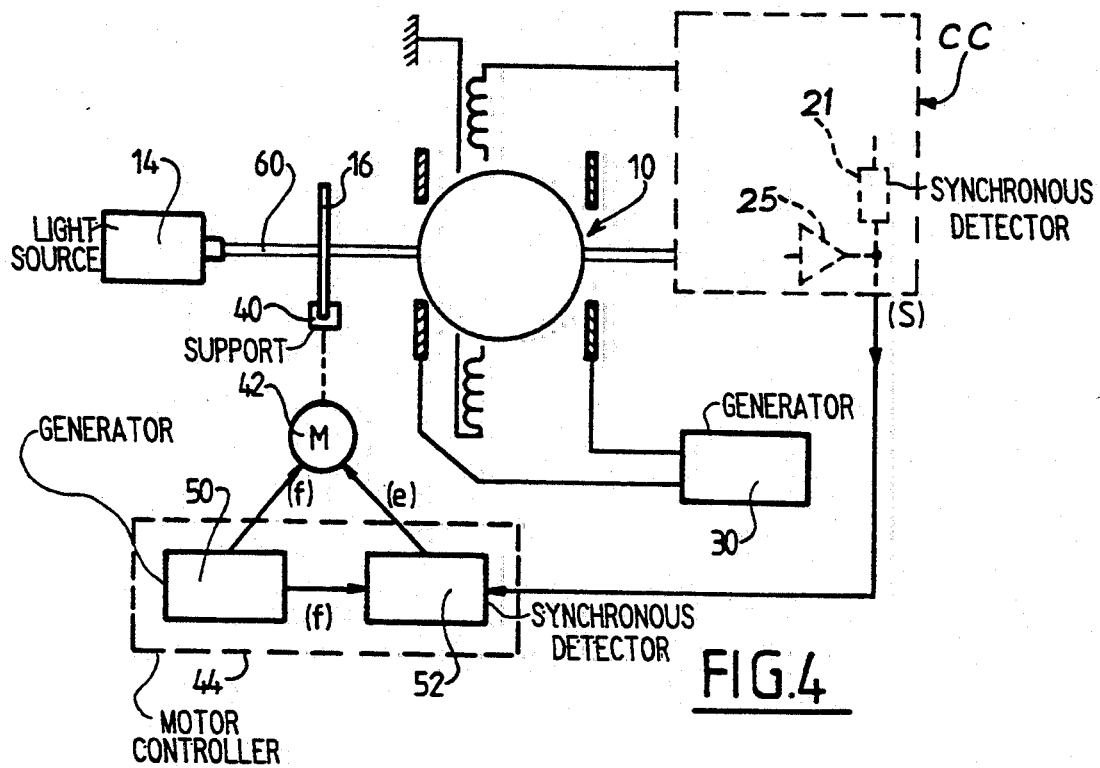

FIG. 4 an embodiment of the control with modulation and synchronous detection.

Figure 5:
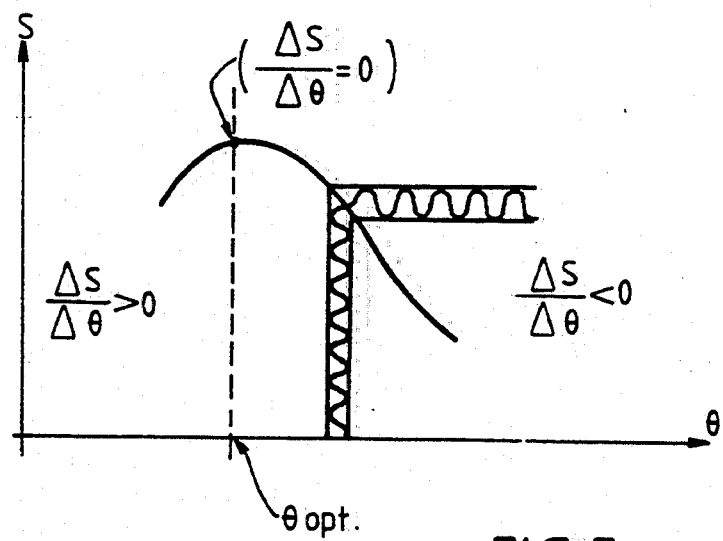

FIG. 5 the principle of said control.

FIG. 6 a variant with multiple windings.

The magnetometer shown in FIG. 2 firstly comprises means already shown in FIG. 1 and which for this reason carry the same numerical references. These consist of the helium-filled cell 10, the laser 14, the linear polarizer 16, the winding 20, means CC (comprising the resonance exciting circuit 22, the detection means 24, the frequency meter 26, the amplifier 25, the synchronous detection means 21 and the integrator 23) and the discharge generator 30. According to the invention the direction of the polarizer 16 can be modified. In the illustrated variant, the polarizer rests on an orientable support 40 controlled in rotation by a motor 42. Means 44 are provided for controlling the motor.

Various variants are provided for realizing these means 44. In the variant illustrated in FIG. 3, said means are constituted by a directional magnetometer 46 giving information on the direction of the ambient field Bo with respect to three axes Ox, Oy and Oz. A circuit 48 processes this information and calculates the optimum orientation of the polarization direction corresponding to said direction of the ambient field. It controls the rotation of the motor 42 in order to give the polarizer said optimum direction.

In the variant illustrated in FIG. 4, the control means 44 of the motor 42 comprise:

a generator 50 supplying the motor with a low frequency signal f, which has the effect of modulating the orientation angle of the polarizer 16, a synchronous detection signal 52 receiving the resonance signal, whose amplitude is modulated at frequency f and a reference signal at said same frequency f supplied by the generator 50.

The synchronous detection circuit 52 supplies a signal e constituting an error signal, which is applied to the motor 42 in a direction such that the rotation of the motor tends to cancel out the error signal.

FIG. 5 illustrates the operation of this control chain. The modulation of the angle $\theta$ of the polarization leads to a modulation of the amplitude of the resonance signal S. The ratio $\Delta S/\Delta\theta$ (in magnitude and in sign) between the modulation amplitude $\Delta S$ of the signal S and the angular modulation amplitude $\Delta\theta$ makes it possible to position the operating point of the magnetometer with respect to the optimum orientation $\theta$opt of the polarization direction. This ratio is zero if the orientation is at an optimum, is negative above it and positive below it. This ratio, or any other equivalent quantity, can therefore be taken as the error signal. It has to be applied to the motor in a sense such that the rotation of the motor then cancels out the error signal.

In another variant illustrated in FIG. 6, use is made of a described arrangement, but which is used with a different objective, in the French patent application simultaneously filed by the present Applicant and entitled "Magnetic resonance magnetometer having multiplexed exciting windings". This arrangement consists of providing the cell 10 with three exciting windings 20x, 20y and 20z arranged around the cell 10 with axes not parallel to one another (e.g. in the form of a trirectangular trihedron), said windings being sequentially put into operation by a multiplexer 50. The frequency of the resonance signal then successively assumes three values Ax, Ay and Az. The multiplexer comprises a generator 52 and a commutator 54 with three switches connected to the three windings.

The use of several multiplexed windings makes it possible to obtain several resonance signals, whose respective frequencies are dependent on the relative orientations of the ambient field with respect to the axes of the windings. The knowledge of these frequencies makes it possible to determine the orientation of the field. In this connection reference can be made to the article by Cohen-Tannoudji published in Annales de Physique, 7, 1962, pp. 423–429 and which gives the amplitude of the signal as a function of the relative angles between the polarization and the field. The optimum direction of the polarization is deduced therefrom. It is the function of the calculating circuit 56, which finally supplies the control signal appropriate for the motor 42.

In all these variants, the light beam can be guided between the source 14 and the cell 10 on the one hand and between the cell 10 and the photoreceiver 24 on the other by an optical fibre FO.

We claim:

1. An optical pumping resonance magnetometer comprising:
    a cell filled with a gas whose atoms have a gyromagnetic ratio $\gamma$, said cell being placed in an ambient magnetic field Bo,
    a light source emitting a light beam,
    a linear polarizer traversed by said beam, said beam having after said polarizer a linear polarization direction and being injected into said cell,
    means for rotating said linear polarization direction,
    a photoreceiver receiving said beam after said cell,
    a directional magnetometer giving information on the direction of an ambient field Bo,
    a circuit for processing said information and for calculating the optimum orientation of said polarization direction corresponding to said direction of the ambient field and for controlling said means for rotating said linear polarization to the optimum direction,
    sampling and detection means for an electric resonance signal at a Larmor frequency $F=\gamma Bo$,
    means for measuring the said frequency F, the amplitude of the ambient magnetic field being reduced from said frequency F by the relation $Bo=F/\gamma$.

2. An optical pumping resonance magnetometer comprising:
    a cell filled with a gas whose atoms have a gyromagnetic ratio $\gamma$, said cell being placed in an ambient magnetic field Bo,
    a light source emitting a light beam,
    a linear polarizer traverse by said beam, said beam having after said polarizer a linear polarization band being injected into said cell,
    means for rotating said linear polarization direction,
    a photoreceiver receiving said beam after said cell,
    sampling and detection means for an electric resonance signal at a Larmor frequency $F=\gamma Bo$, said detection means comprising several detection windings arranged around said cell with axes having different directions, said windings being sequentially put into service by a multiplexer, the frequency of the resonance signal assuming successively the same number of values (Ax, Ay, Az) as there are windings,
    a processing circuit for calculating, as a function of the different frequencies (Ax, Ay, Az) of the resonance signal, the orientation of said magnetic ambient field Bo and for determining the optimum orientation of said linear polarization corresponding to said ambient magnetic field and for controlling said means for rotating said linear polarization direction so as to give to said polarization the optimum direction,
    means for measuring said frequency F of said electric resonance signal, the amplitude of the ambient magnetic field being reduced from said frequency F by the relation $Bo=F/\gamma$.

3. An optical pumping resonance magnetometer comprising:
    a cell filled with a gas whose atoms have a gyromagnetic ratio $\gamma$ said cell being placed in an ambient magnetic field Bo,
    a light source emitting a light beam,
    a linear polarizer traversed by said beam, said beam having after said polarizer a linear polarization direction, and being injected into said cell,
    means for rotating said linear polarization direction at a low frequency,
    means for modulating at a low frequency said linear polarization direction,
    a photoreceiver receiving said beam after said cell,
    sampling and detection means for an electric resonance signal at a Larmor frequency $F=\gamma Bo$, said signal being modulated at said low frequency,
    a synchronous detection circuit receiving said electric resonance signal modulated at said low frequency and a reference signal at said low frequency, said synchronous detection circuit supplying a signal constituting an error signal, said error signal being applied to said means for rotating said polarization direction in a sense such that the rotation tends to cancel out said error signal,
    means for measuring said frequency $F=\gamma Bo$, the amplitude of said ambient magnetic field being reduced from the frequency F by the relation $Bo=F/\gamma$.

4. Magnetometer according to any one of claims 1 to 3, wherein means for rotating said linear polarization direction incorporate an orientable support, on which rests said polarizer, a motor acting on the said support and control means for the said motor.

5. Magnetometer according to any of claims 1 to 3, wherein said gas of said cell is helium.

6. Magnetometer according to claim 5, comprising further means for creating a high frequency discharge in said helium cell.

7. Magnetometer according to any one of claims 1 to 3, wherein said light source is a laser.

8. Magnetometer according to any one of claims 1-3, wherein said light beam is guided between said source and said cell and between said cell and said photoreceiver by an optical fibre.

* * * * *